(12) United States Patent
Kim et al.

(10) Patent No.: US 9,893,090 B2
(45) Date of Patent: Feb. 13, 2018

(54) ARRAY SUBSTRATE AND FABRICATION METHOD THEREOF, AND DISPLAY DEVICE

(71) Applicant: BOE Technology Group Co., Ltd., Beijing (CN)

(72) Inventors: Heecheol Kim, Beijing (CN); Youngsuk Song, Beijing (CN); Seongyeol Yoo, Beijing (CN); Seungjin Choi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 288 days.

(21) Appl. No.: 14/424,717

(22) PCT Filed: May 23, 2014

(86) PCT No.: PCT/CN2014/078267
§ 371 (c)(1),
(2) Date: Feb. 27, 2015

(87) PCT Pub. No.: WO2015/096369
PCT Pub. Date: Jul. 2, 2015

(65) Prior Publication Data
US 2016/0049425 A1    Feb. 18, 2016

(30) Foreign Application Priority Data
Dec. 26, 2013    (CN) .......................... 2013 1 0739422

(51) Int. Cl.
*G02F 1/1362*    (2006.01)
*H01L 27/12*    (2006.01)
(Continued)

(52) U.S. Cl.
CPC .......... *H01L 27/124* (2013.01); *G02F 1/1368* (2013.01); *G02F 1/13439* (2013.01);
(Continued)

(58) Field of Classification Search
CPC ................................................ G02F 1/136286
See application file for complete search history.

(56) References Cited

U.S. PATENT DOCUMENTS

2006/0139525 A1    6/2006    Ahn et al.
2007/0284627 A1    12/2007    Kimura
(Continued)

FOREIGN PATENT DOCUMENTS

CN    101661174 A    3/2010
CN    101770130 A    7/2010
(Continued)

OTHER PUBLICATIONS

International Search Report and Written Opinion dated Sep. 26, 2014 (PCT/CN2014/078267); ISA/CN.
Oct. 10, 2015—(CN)—First Office Action Appn 201310739422.6 with English Tran.
(Continued)

*Primary Examiner* — Nathanael R Briggs
*Assistant Examiner* — Alexander Gross
(74) *Attorney, Agent, or Firm* — Banner & Witcoff, Ltd.

(57) ABSTRACT

An array substrate and a fabrication method thereof, and a display device are provided. The array substrate comprises a gate line and a data line intersecting with each other. The data line and the gate line are formed in a same layer on a substrate, the data line is disconnected in a region of the gate line. A connection pattern is formed in the region of the gate line, the connection pattern is insulated from the gate line, and ends of the data line located on both sides of the gate line are electrically connected by the connection pattern.

12 Claims, 8 Drawing Sheets

(51) Int. Cl.
  *G02F 1/1333* (2006.01)
  *G02F 1/1343* (2006.01)
  *G02F 1/1368* (2006.01)
  *H01L 29/66* (2006.01)
  *H01L 29/786* (2006.01)

(52) U.S. Cl.
  CPC .. *G02F 1/133345* (2013.01); *G02F 1/136227* (2013.01); *G02F 1/136286* (2013.01); *H01L 27/1222* (2013.01); *H01L 27/1259* (2013.01); *H01L 29/66765* (2013.01); *H01L 29/66969* (2013.01); *H01L 29/7869* (2013.01); *H01L 29/78669* (2013.01); *H01L 29/78678* (2013.01); *G02F 2001/136295* (2013.01)

(56) References Cited

U.S. PATENT DOCUMENTS

| | | | |
|---|---|---|---|
| 2010/0163881 A1 | 7/2010 | Kang et al. | |
| 2012/0256183 A1 | 10/2012 | Zhang | |
| 2013/0161604 A1* | 6/2013 | Huang | G02F 1/13458 257/43 |

FOREIGN PATENT DOCUMENTS

| | | |
|---|---|---|
| CN | 102645801 A | 8/2012 |
| CN | 103730474 A | 4/2014 |

OTHER PUBLICATIONS

Jun. 28, 2016—International Preliminary Report on Patentability Appn PCT/CN2014/078267.

\* cited by examiner

C-C

D-D

E-E

US 9,893,090 B2

ARRAY SUBSTRATE AND FABRICATION METHOD THEREOF, AND DISPLAY DEVICE

The application is a U.S. National Phase Entry of International Application No. PCT/CN2014/078267 filed on May 23, 2014, designating the United States of America and claiming priority to Chinese Patent Application No. 201310739422.6 filed on Dec.26, 2013. The present application claims priority to and the benefit of the above-identified applications and the above-identified applications are incorporated by reference herein in their entirety.

TECHNICAL FIELD

Embodiments of the disclosure relate to an array substrate and a fabrication method thereof, and a display device.

BACKGROUND

With developments of Thin Film Transistor Liquid Crystal Display (TFT-LCD), various semiconductor components and application technologies thereof in display devices have made extraordinary progress as well.

In a fabrication process of an array substrate of the TFT-LCD, in order to further improve an aperture ratio, source and drain electrodes of a TFT and data lines are generally made of a transparent metal oxide (e.g., indium tin oxide (ITO)). A cross-sectional structure of such an array substrate along a direction of data line is shown in FIG. 1. As shown in FIG. 1, a gate line 11 (including a gate electrode of the TFT) and a gate insulating layer 12 are sequentially formed on a transparent substrate 10, a data line 13 is formed on the gate insulating layer 12, the data line 13 is made of an ITO material, and the data line 13 has an etching blocking layer 14 and a transparent electrode 15 sequentially formed on the surface thereof.

In the array substrate as shown in FIG. 1, there is a relatively long overlapping region between the data line 13 and the transparent electrode 15, and thereby, in a case that power is on, a parasitic capacitance Cdc will be generated between the data line 14 and the transparent electrode 15. At the moment when a voltage signal is input to the data line 14, due to presence of the parasitic capacitance, a change of the voltage signal from high to low on the data line 14 will make the voltage of the transparent electrode 15 change correspondingly, which thereby causes a change of voltage applied on liquid crystal layer, so that flicker of display screen occurs, and meanwhile data line delay and power consumption will increase as well.

SUMMARY

According to an embodiment of the present disclosure, there is provided an array substrate. The array substrate comprises a gate line and a data line intersecting with each other. The data line and the gate line are formed in a same layer on a substrate, the data line is disconnected in a region of the gate line; and a connection pattern is formed in the region of the gate line, the connection pattern is insulated from the gate line, and ends of the data line located on both sides of the gate line are electrically connected by the connection pattern.

According to an embodiment of the present disclosure, there is provided a display device. The display device comprises the array substrate as described above.

According to an embodiment of the present disclosure, there is provided a fabrication method of an array substrate.

The method comprises: forming a gate line and a data line in a same layer on a substrate, the data line being disconnected in a region of the gate line; forming a connection pattern corresponding to the region of the gate line on the substrate having the gate line and the data line formed thereon, the connection pattern being insulated from the gate line, and ends of the data line located on both sides of the gate line being electrically connected by the connection pattern.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 2:
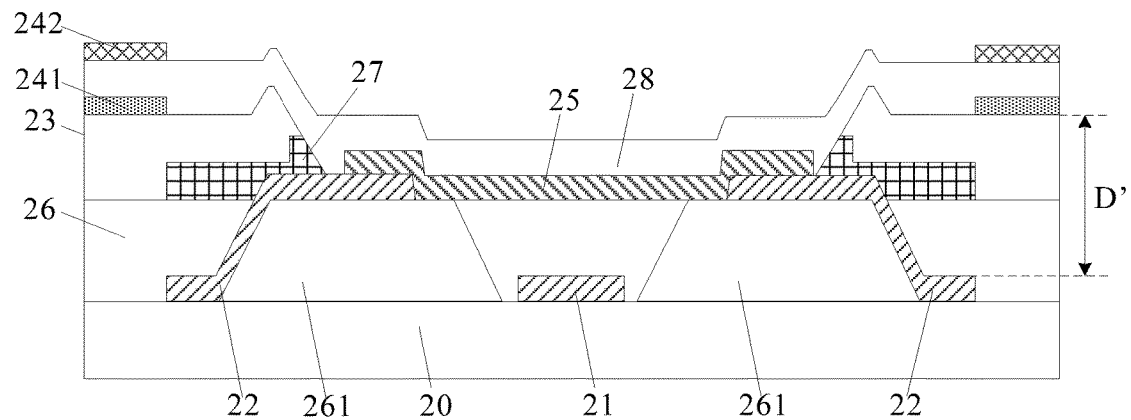
FIG. 2 is a structural schematic view illustrating an array substrate according to an embodiment of the present disclosure.

An array substrate is provided by an embodiment of the present disclosure. As shown in FIG. 2, the array substrate comprises: a gate line 21 and a data line 22 intersecting with each other, the data line 22 and the gate line 21 are formed in a same layer, and the data line 22 is disconnected in a region of the gate line 21. The array substrate further comprises a first transparent electrode 241, a first insulating layer 26, a gate insulating layer 27 and an etching blocking layer 23 are disposed between at least a portion of the data line and the first transparent electrode 241.

For example, the gate line 21 and the data line 22 are formed of a same metal layer, and are formed on a transparent substrate 20 by one patterning process.

Further, the region of the gate line 21 has a connection pattern 25, the connection pattern 25 is insulated from the gate line 21, and ends of the data line 22 located on both sides of the gate line 21 is electrically connected by the connection pattern 25.

In the array substrate provided by the embodiment of the present disclosure, the data line and the gate line are fabricated in the same layer, the data line is disconnected in the region of the gate line, and the disconnected data line is electrically connected by the connection pattern disposed in the region of the gate line. In this way, on the basis that quality of the gate line and the data line is ensured, a distance between the data line and the transparent electrode is significantly increased, so that a parasitic capacitance Cdc between the data line and the transparent electrode is effectively reduced, and a poor output voltage due to an excessively large parasitic capacitance is avoided, which effectively prevents flicker of the display screen, reduces data line delay and power consumption, and improves quality of the display device.

As shown in FIG. 2, the first insulating layer 26 covers the gate line 21 and other portions of the data line 22 except the ends located on both sides of the gate line. The ends of the data line 22 located on both sides of the gate line 21 are exposed on the surface of the first insulating layer 26. In the region of the gate line 21, the connection pattern 25 is formed on the surface of the first insulating layer 26.

Specifically, in order that the ends of the data line 22 located on both sides of the gate line 21 are exposed on the surface of the first insulating layer 26, an insulating layer pattern 261 with a certain height is formed in advance on the transparent substrate 20 by a patterning process, and the insulating layer pattern 261 is located in regions on both sides of the gate line 21 in which the data line is to be formed. The gate line 21 and the data line 22 are then formed on the substrate having the insulating layer pattern 261 formed thereon, and the ends of the data line 22 located on both sides of the gate line 21 are provided on the surface of the insulating layer pattern 261. Then, an insulating layer material is deposited to form the first insulating layer 26 and at least expose the data line located on the surface of the insulating layer pattern 261.

Of course, the above is only an exemplification of forming the first insulating layer 26 with the above-described structure, and the above-described first insulating layer 26 may be formed by other processes, which will not be limited by the present disclosure.

Figure 1:
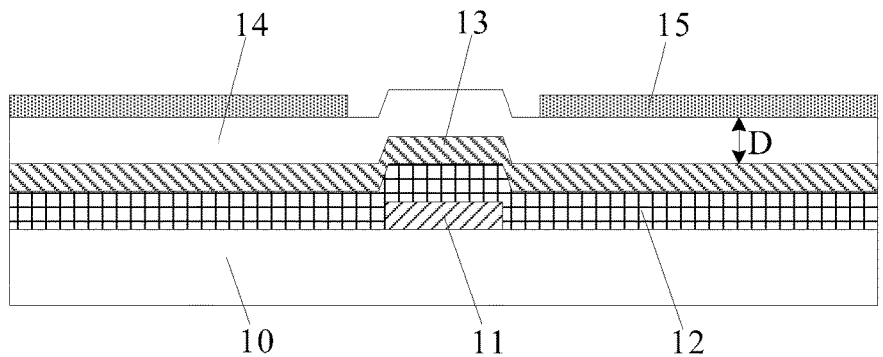
FIG. 1 is a structural schematic view illustrating an array substrate according to one technique.

In the array substrate shown in FIG. 2, a distance D' between the data line 22 and the first transparent electrode 241 is much greater than a distance D between the data line 13 and the transparent electrode 15 in FIG. 1. It can be seen according to a parallel plate capacitance equation $C=\epsilon S/d$ that, when other conditions remain unchanged, the capacitance is reduced by increasing the distance between the two electrodes. Thus, in the embodiment of the present disclosure, the parasitic capacitance between the data line 22 and the first transparent electrode 241 can be effectively reduced, so as to effectively reduce influence of the transient voltage generated by the parasitic capacitance.

In the embodiment of the present disclosure, the array substrate for example further comprises a TFT; a gate electrode of the TFT (not shown in the diagram) is fabricated in a same layer with the gate line 21.

In a channel region of the TFT, the gate electrode of the TFT is partially exposed on the surface of the first insulating layer 26. In order that the gate electrode of the TFT is partially exposed on the surface of the first insulating layer 26, the insulating layer pattern 261 with a certain height is formed in the channel region of the TFT at the same time that the insulating layer pattern 261 is formed in the regions on both sides of the gate line 21 in which the data line is to be formed. The gate electrode is formed at the same time that the data line and the gate line are formed. Then, the insulating layer material is deposited to form the first insulating layer 26 and partially expose the gate electrode of the TFT on the surface of the first insulating layer 26. In this way, the gate electrode of the TFT is raised, so that there is no significant height difference between the channel region of the TFT and the ends of the data line located on both sides of the gate line, and in a subsequent processing procedure, a disconnection between the source electrode of the TFT and the connection pattern 25 due to a relatively large height difference is avoided, so as to improve quality of the display panel.

Further, the array substrate for example further comprises a gate insulating layer 27 and an active layer (not shown in FIG. 2) sequentially formed on the gate electrode of the TFT.

The active layer for example is made of a transparent metal oxide material with a semiconductor characteristic. For example, the metal oxide material includes at least one of indium gallium zinc oxide (IGZO), indium-gallium oxide (IGO), indium tin zinc oxide (ITZO), aluminum zinc oxide (AlZnO). Compared with an amorphous silicon (a-Si) TFT or a low temperature polysilicon (LTPS) TFT, the TFT with the active layer made of the transparent metal oxide material has advantages such as a low requirement on preparation temperature and a high mobility, and such TFT is applicable to high frequency display products and high-resolution display products and has advantages such as a low investment cost and a low operation safeguard cost with respect to the LTPS TFT technology.

In the array substrate shown in FIG. 2, the gate insulating layer 27 is formed on the surface of the first insulating layer 26. The etching blocking layer 23 is formed on the gate insulating layer 27.

In the region of the gate line 21, a via hole runs through the etching blocking layer 23 and the gate insulating layer 27, to expose the first insulating layer 26 and the ends of the data line 22 located on both sides of the gate line 21 at the bottom of the via hole.

In this way, the connection pattern 25 is further formed in the region of the via hole, which thereby can effectively define a region covered by the connection pattern 25. By using the array substrate with such a structure, since the first insulating layer 26 with a certain thickness and the gate insulating layer 27 are provided between the data line 22 and the first transparent electrode 241, the distance between the data line 22 and the first transparent electrode 241 is increased, and the parasitic capacitance Cdc between the data line 22 and the first transparent electrode 241 is reduced.

Figure 3:
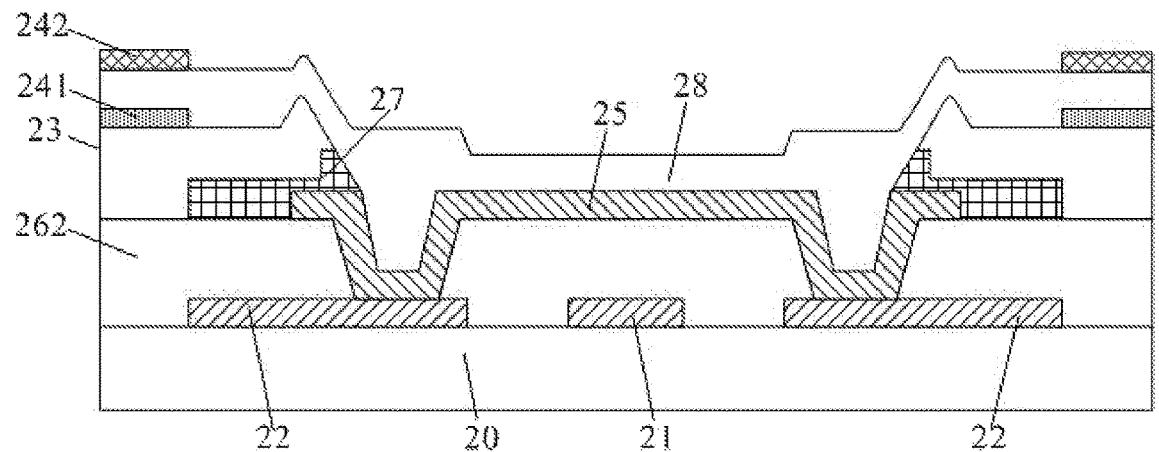
FIG. 3 is a structural schematic view illustrating another array substrate according to an embodiment of the present disclosure.

Alternatively, as shown in FIG. 3, the structure of the array substrate provided by the embodiment of the present disclosure comprises: a first insulating layer 262, and the first insulating layer 262 covers the gate line 21 and the data line 22. In the region of the gate line 21, the connection pattern 25 is formed on the surface of the first insulating layer 262, and the connection pattern 25 is electrically connected with the ends of the data line 22 located on both sides of the gate line 21 by the via holes running through the first insulating layer 262.

The array substrate shown in FIG. 3 is different from the array substrate shown in FIG. 2 in that it is not necessary to form the insulating layer pattern 261 on the surface of the transparent substrate in advance, which can simplify a fabrication process of the array substrate to some extent and reduce production difficulty. Other structures of the array substrate shown in FIG. 3 are similar to the corresponding structures of the array substrate shown in FIG. 2.

In the embodiment of the present disclosure, the first insulating layer 26 shown in FIG. 2 and the first insulating layer 262 shown in FIG. 3 for example are made of materials such as an organic resin material with a good insulating property, which will not be limited by the present disclosure.

It should be noted that, the TFT-LCD array substrate provided by the embodiment of the present disclosure is applicable to the liquid crystal display devices of a Fringe Field Switching (FFS) type, an Advanced-Super Dimensional Switching (AD-SDS, abbreviated as ADS) type, an In Plane Switch (IPS) type, a Twist Nematic (TN) type and the like. In the ADS type, a multi-dimensional electric field is formed with both an electric field generated at edges of slit electrodes in a same plane and an electric field generated between a slit electrode layer and a plate-like electrode layer, so that liquid crystal molecules at all orientations, which are located directly above the electrodes or between the slit electrodes in a liquid crystal cell, can be rotated, In this way, the work efficiency of liquid crystal can be enhanced and the light transmittance can be increased.

Each of the liquid crystal display devices of the above-mentioned types comprises an opposite substrate and an array substrate that are bonded with each other. In the TN-type display device, a common electrode is disposed on the opposite substrate, and a pixel electrode is disposed on the array substrate; and in the FFS-type display device, the ADS-type display device and the IPS-type display device, both the common electrode and the pixel electrode are disposed on the array substrate.

In FIG. 2, the FFS-type display device is illustrated as an example. As shown in FIG. 2, the array substrate further comprises: a passivation layer 28 formed on the first transparent electrode 241, the passivation layer 28 covering the connection pattern 25 located in the region of the gate line 21; and a second transparent electrode 242 formed on the surface of the passivation layer.

For example, the first transparent electrode 241 is the pixel electrode, and the second transparent electrode 242 is the common electrode; and the first transparent electrode 241 is of a plate-like structure, and the second transparent electrode 242 includes a plurality of spaced strip electrodes.

In the array substrate of the FFS-type display device, the common electrode and the pixel electrode are disposed in different layers; for example, the electrode located in the upper layer includes a plurality of strip electrodes, and the electrode located in the lower layer includes a plurality of strip electrodes or is of a plate-like structure. In the embodiment of the present disclosure, the electrode located in the lower layer is of the plate-like structure as an example. Being disposed in different layers is for at least two kinds of patterns, the at least two kinds of patterns being disposed in different layers refers to that at least two thin films are respectively patterned to form the at least two kinds of patterns. Two kinds of patterns being disposed in different layers refers to that two thin films are respectively patterned to form the two kinds of patterns. For example, the common electrode and the pixel electrode being disposed in different layers refers to that a first transparent conductive film is patterned to form the electrode in the lower layer and a second transparent conductive film is patterned to form the electrode in the upper layer, and the electrode in the lower layer is the common electrode (or the pixel electrode) and the electrode in the upper layer is the pixel electrode (or the common electrode).

The array substrate provided by the embodiment of the present disclosure is also applicable to the IPS-type display device. In this case, the common electrode and the pixel electrode are disposed in the same layer, the common electrode includes a plurality of first strip electrodes, the pixel electrode includes a plurality of second strip electrodes, and the first strip electrodes and the second strip electrodes are arranged alternatively. Being disposed in the same layer is for at least two kinds of patterns, and the least two kinds of patterns being disposed in the same layer refers to that a same thin film is patterned to form the at least two kinds of patterns. For example, the common electrode and the pixel electrode being disposed in the same layer refers to that the same transparent conductive film is patterned to form the common electrode and the pixel electrode. The pixel electrode refers to the electrode electrically connected with the data line by a switching unit (for example, a thin film transistor), and the common electrode refers to the electrode electrically connected with a common electrode line.

An embodiment of the present disclosure further provides a display device, the display device comprising the array substrate as described above.

The array substrate comprises: a gate line 21 and a data line 22 intersecting with each other, the data line 22 and the gate line 21 are formed in a same layer, and the data line 22 is disconnected in a region of the gate line 21. The array substrate further comprises a first transparent electrode 241, a first insulating layer 26 (or a first insulating layer 262), a gate insulating layer 27 and an etching blocking layer 23 are disposed between at least a portion of the data line and the first transparent electrode 241.

The display device for example is: a liquid crystal panel, an E-paper, an OLED panel, a liquid crystal television, a liquid crystal display, a digital photo frame, a mobile phone, a tablet personal computer, and any other product or component having a display function.

The display device provided by the embodiment of the present disclosure comprises the array substrate, the data line and the gate line is fabricated in the same layer, the data line is disconnected in the region of the gate line, and the disconnected data line is electrically connected with the connection pattern disposed in the region of the gate line. Thus, on the basis that quality of the gate line and the data line is ensured, a distance between the data line and the transparent electrode can be significantly increased, so that the parasitic capacitance Cdc between the data line and the transparent electrode can be effectively reduced and a poor output voltage due to the excessively large parasitic capacitance is avoided, which effectively prevents flicker of the display screen, reduces data line delay and power consumption, and improves quality of the display device.

An embodiment of the present disclosure further provides a fabrication method of an array substrate, the method comprises:

S401: forming a gate line and a data line in a same layer on a transparent substrate, the data line being disconnected in a region of the gate line.

For example, a metal film is provided on the transparent substrate, and then the metal film is patterned by one patterning process to form the gate line and the data line in the same layer.

S402: forming a connection pattern corresponding to the region of the gate line on the transparent substrate having the gate line and the data line formed thereon, the connection pattern being insulated from the gate line, and ends of the data line located on both sides of the gate line are electrically connected by the connection pattern.

In the fabrication method of the array substrate provided by the embodiment of the present disclosure, the data line and the gate line is fabricated in the same layer, the data line is disconnected in the region of the gate line, and the disconnected data line is electrically connected with the connection pattern disposed in the region of the gate line. Thus, on the basis that quality of the gate line and the data line is ensured, a distance between the data line and the transparent electrode can be significantly increased, so that the parasitic capacitance Cdc between the data line and the transparent electrode can be effectively reduced and a poor output voltage due to the excessively large parasitic capacitance is avoided, which effectively prevents flicker of the display screen, reduces data line delay and power consumption, and improves quality of the display device.

Further, the fabrication method of the array substrate provided by the embodiment of the present disclosure comprises:

S501: forming an insulating layer pattern on the transparent substrate by a patterning process.

Figure 4:
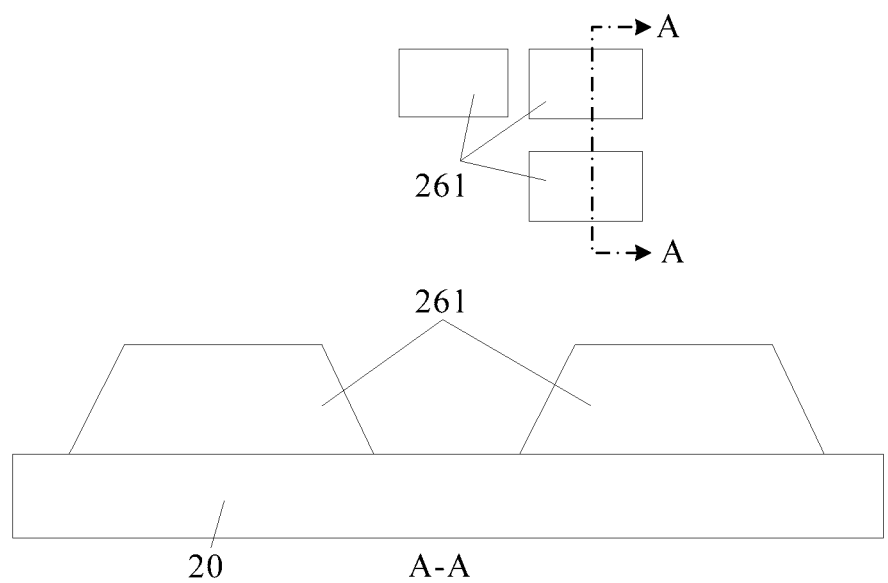
FIG. 4 is a partial plan view of a substrate after an insulating layer pattern is formed and a sectional view thereof taken along an A-A direction.

As shown in the plan view of the array substrate in FIG. 4, the insulating layer pattern 261 is formed in regions on both sides of the gate line in which the data line is to be formed. In addition, the insulating layer pattern 261 for example is further formed in a channel region of a TFT.

The transparent substrate for example is made of a transparent material with certain strength, such as glass or transparent resin.

On the surface of the transparent substrate, the insulating layer pattern is formed by one patterning process. For example, an organic resin layer with a certain thickness is firstly coated on the surface of the transparent substrate, and is then is patterned by one patterning process with a mask to form the insulating layer pattern 261 as shown in FIG. 4.

S502: forming a gate electrode of the TFT, the gate line and the data line on the substrate having the insulating layer pattern formed thereon by a patterning process, the ends of the data line located on both sides of the gate line covering the insulating layer pattern.

Figure 5:
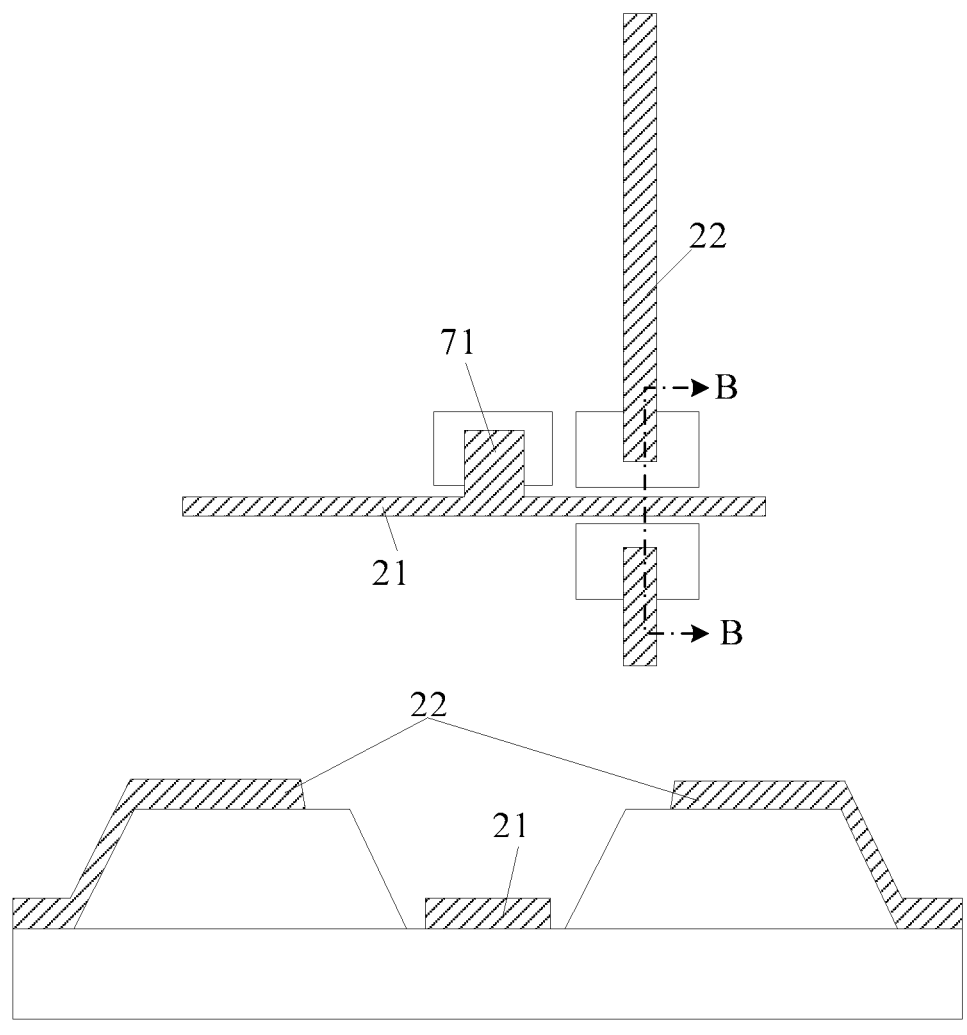
FIG. 5 is a partial plan view of the substrate after a gate line, a data line and a gate electrode of a TFT are formed and a sectional view thereof taken along a B-B direction.

For example, a metal layer is formed on the substrate having the insulating layer pattern formed thereon by using plasma enhanced chemical vapor deposition (PECVD), magnetron sputtering, thermal evaporation, or other film-forming methods. The metal layer for example is a single-layer thin film made of molybdenum, aluminum, aluminum rubidium alloy, tungsten, chromium, copper and other metals, or is a multi-layer thin film made of the above metals. The metal layer is patterned to form the gate electrode 71 of the TFT, the gate line 21 and the data line 22, as shown in the plan view of the array substrate in FIG. 5. The gate electrode 71 of the TFT is located on the insulating layer pattern 261 in the channel region.

S503: forming an insulating layer on the gate line and the data line.

Figure 6:
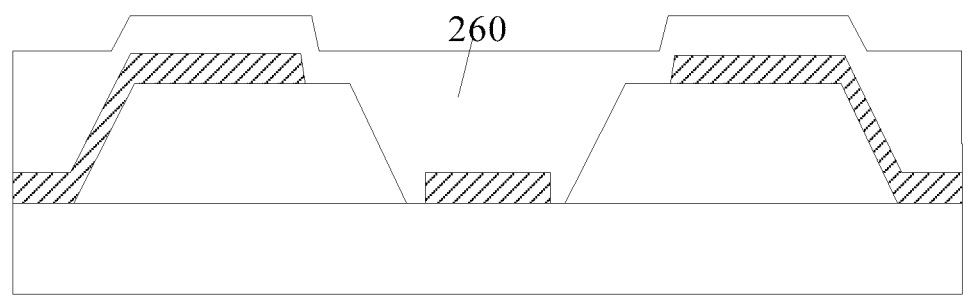
FIG. 6 is a structural schematic view illustrating the substrate after an insulating material layer is formed.

For example, as shown in FIG. 6, an organic resin layer with a certain thickness is coated on the substrate having the gate line and the data line formed thereon to form an insulating material layer 260. The insulating material layer 260 completely cover the gate line and the data line.

S504: processing the insulating material layer by using an ashing process to at least expose the ends of the data line located on the surface of the insulating layer pattern and to form the first insulating layer.

Figure 7:
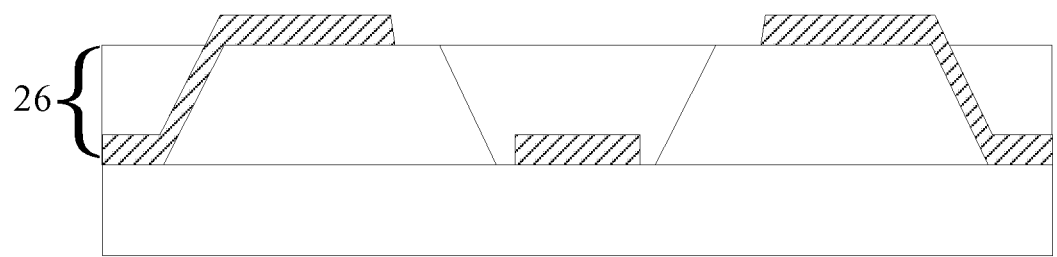
FIG. 7 is a structural schematic view illustrating the substrate after a first insulating layer is formed.

As shown in FIG. 7, the insulating material layer 260 undergoes the ashing process, and an overall thickness thereof will decrease until the ends of the data line located on the surface of the insulating layer pattern are exposed to form the first insulating layer 26. In the embodiment of the present disclosure, the ashing process is employed as an example. It should be appreciated that, in order to expose the ends of the data line located on the surface of the insulating layer pattern, other patterning processes may be used, which will not be limited by the present disclosure.

Thus, the ends of the data line located on both sides of the gate line are exposed on the surface of the first insulating layer, and other portions of the data line except the ends thereof located on both sides of the gate line are covered by the first insulating layer.

S505: forming a gate insulating layer on the substrate having the first insulating layer formed thereon.

Figure 8:
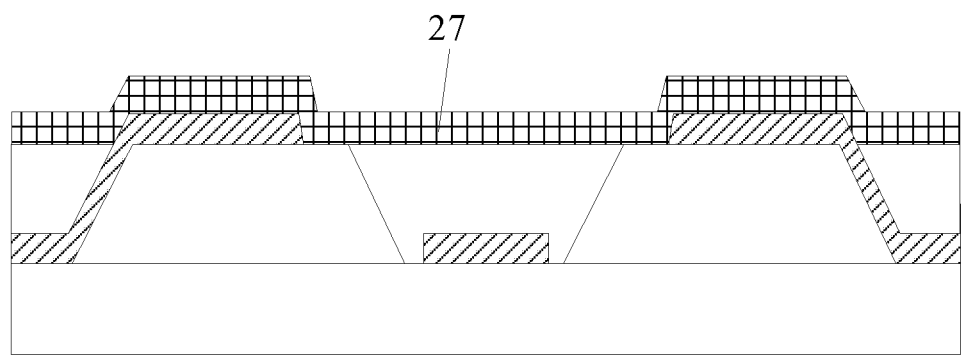
FIG. 8 is a structural schematic view illustrating the substrate after a gate insulating layer is formed.

As shown in FIG. 8, the gate insulating layer 27 with a uniform thickness is formed on the substrate having the first insulating layer 26 formed thereon.

S506: forming an active layer on the gate insulating layer corresponding to the gate electrode of the TFT by a patterning process.

Figure 9:
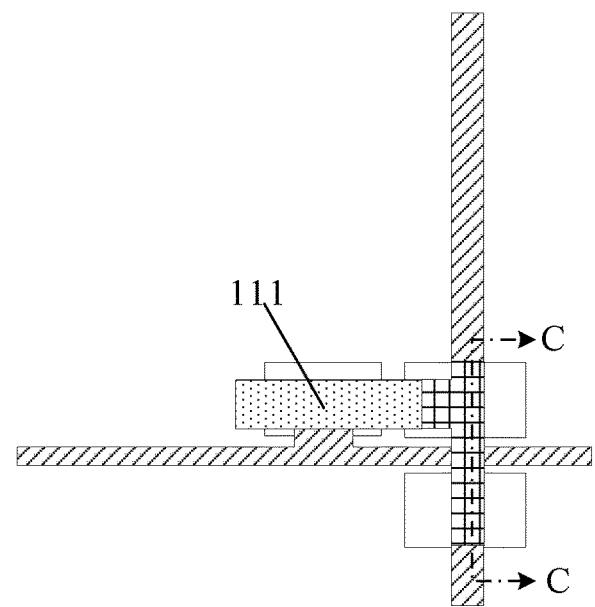
FIG. 9 is a partial plan view of the substrate after an active layer is formed and a sectional view thereof taken along a C-C direction.

For example, a semiconductor layer is formed on the substrate having the above-described structure formed thereon, and the active layer 111 shown in the plan view of the array substrate in FIG. 9 is formed by the patterning process with a mask.

It should be noted that, in the embodiment of the present disclosure, the active layer 111 for example is made of a transparent metal oxide material with a semiconductor characteristic. For example, the metal oxide material includes at least one of indium gallium zinc oxide (IGZO), indium-gallium oxide (IGO), indium tin zinc oxide (ITZO), aluminum zinc oxide (AlZnO). Compared with an amorphous silicon (a-Si) TFT or a low temperature polysilicon (LTPS) TFT, the TFT with the active layer made of the transparent metal oxide material has advantages such as a low requirement on preparation temperature and a high mobility, and such TFT is applicable to high frequency display products and high-resolution display products and has advantages such as a low investment cost and a low operation safeguard cost with respect to the LTPS TFT technology.

S507: forming an etching blocking layer on the substrate having the active layer formed thereon.

Figure 10:
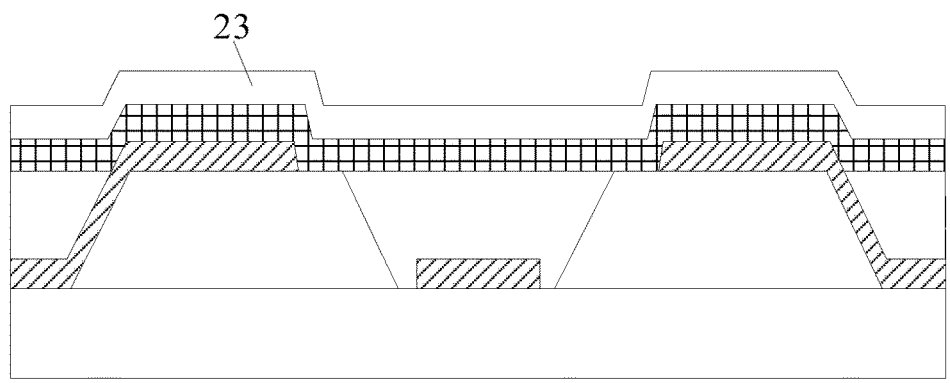
FIG. 10 is structural schematic view illustrating the substrate after an etching blocking layer is formed.

The etching blocking layer 23 is shown in FIG. 10. For example, the etching blocking layer is coated or deposited on the substrate having the above-described structure formed thereon.

S508: forming a via hole running through the etching blocking layer and the gate insulating layer, to expose the first insulating layer and the ends of the data line located on both sides of the gate line at the bottom of the via hole.

Figure 11:
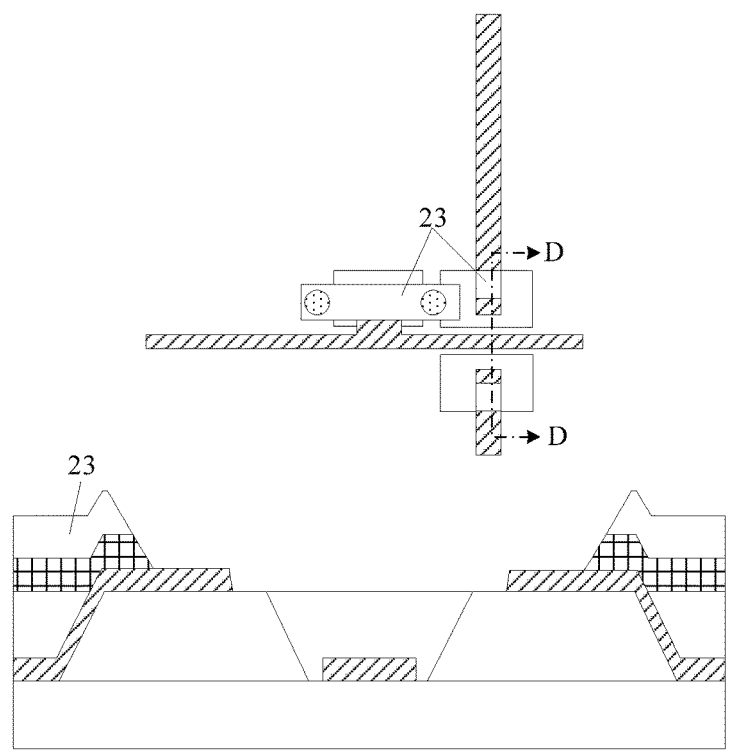
FIG. 11 is a partial plan view of the substrate after a via hole is formed and a sectional view thereof taken along a D-D direction.

At this time, the structure of the substrate is shown in FIG. 11.

Thus, the connection pattern 25 is subsequently formed in the region of the via hole, which thereby can effectively define the region covered by the connection pattern 25. By using the array substrate with such structure, the first insulating layer 26 and the gate insulating layer 27 with certain thicknesses are provided between the data line 22 and the first transparent electrode 241, the distance between the data line 22 and the first transparent electrode 241 is increased, and the parasitic capacitance Cdc between the data line 22 and the first transparent electrode 241 is reduced.

S509: forming the connection pattern on the first insulating layer corresponding to the region of the gate line by a patterning process.

Figure 12:
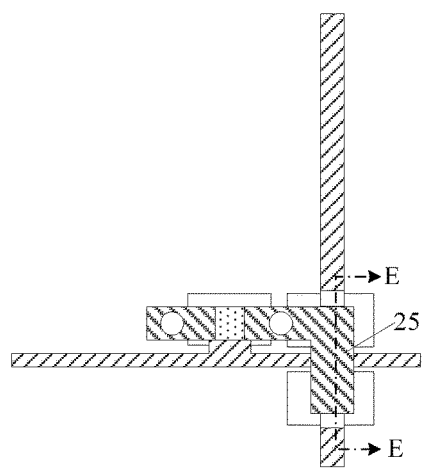
FIG. 12 is a partial plan view of the substrate after a connection pattern and source and drain electrodes of the TFT are formed and a sectional view thereof taken along an E-E direction.
Figure 12:
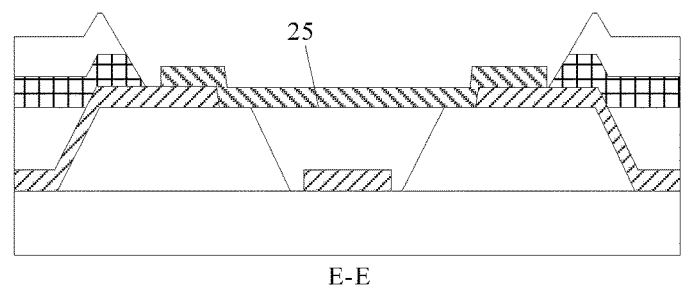

The structure of the substrate having the connection pattern 25 formed thereon is shown in FIG. 12. The ends of the data line on both sides of the gate line are electrically connected by the connection pattern 25.

S510: forming a first transparent electrode on the substrate having the etching blocking layer formed thereon by a patterning process.

Figure 13:
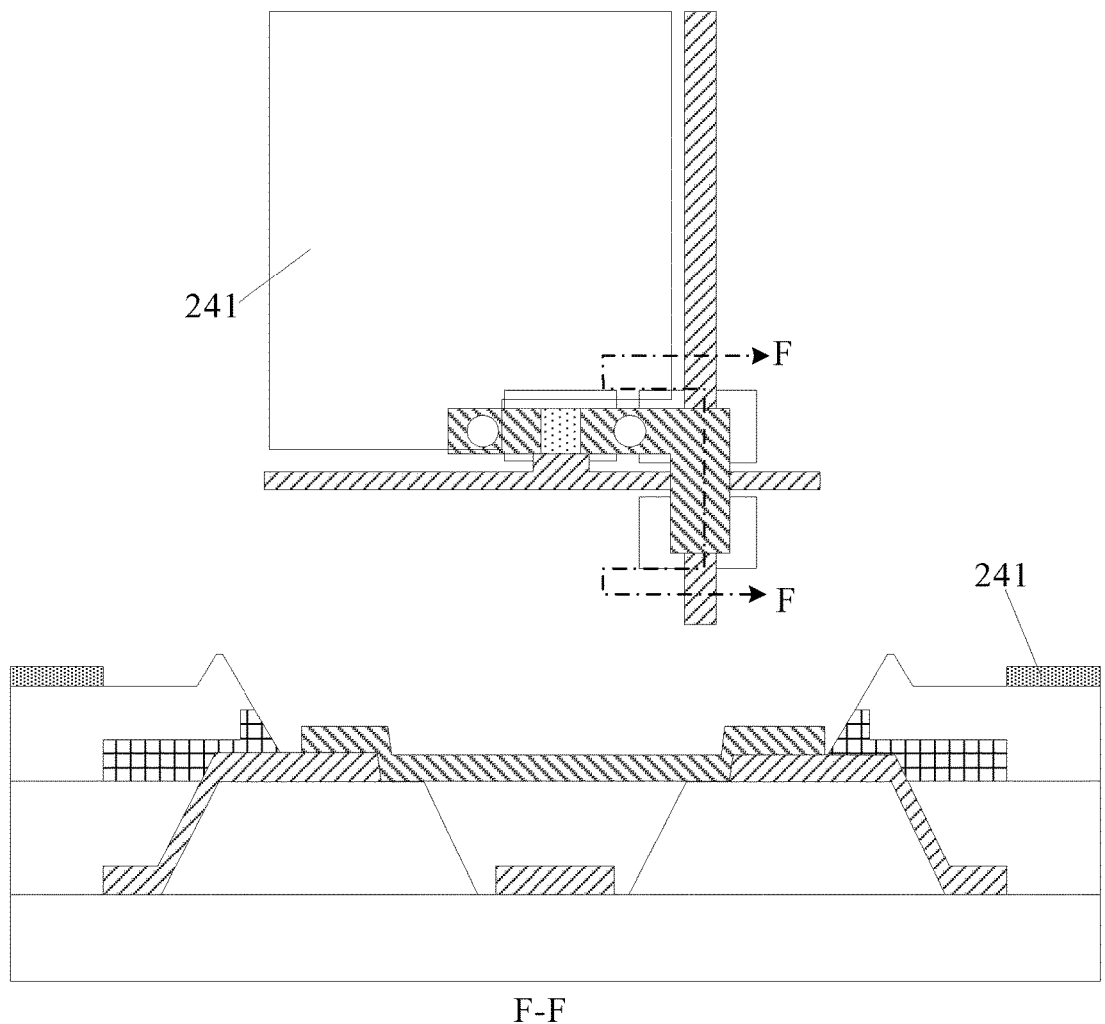
FIG. 13 is a partial plan view of the substrate after a first transparent electrode is formed and a sectional view thereof taken along an F-F direction.

The substrate having the first transparent electrode 241 formed thereon is shown in FIG. 13.

S511: forming a passivation layer on the substrate having the first transparent electrode formed thereon by a patterning process, the passivation layer covering the connection pattern located in the region of the gate line.

Figure 14:
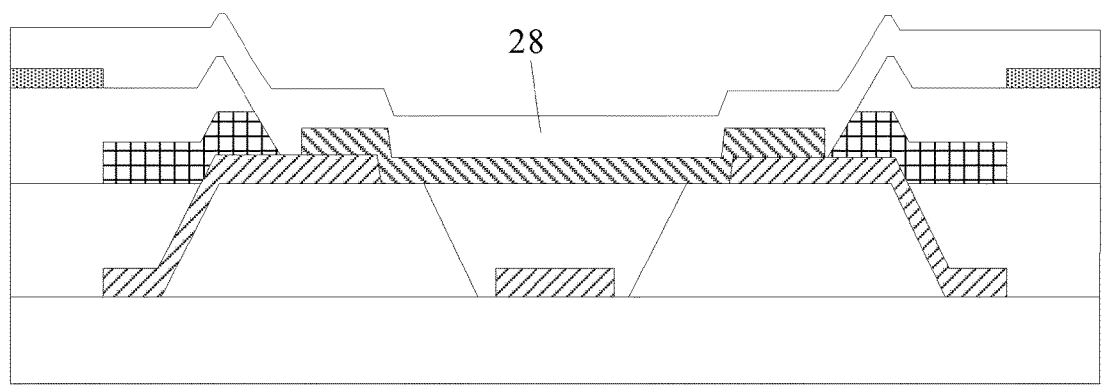
FIG. 14 is a structural schematic view illustrating the substrate after a passivation layer is formed.

The substrate having the passivation layer 28 formed thereon is shown in FIG. 14.

S512: forming the second transparent electrode on the passivation layer by a patterning process.

Figure 15:
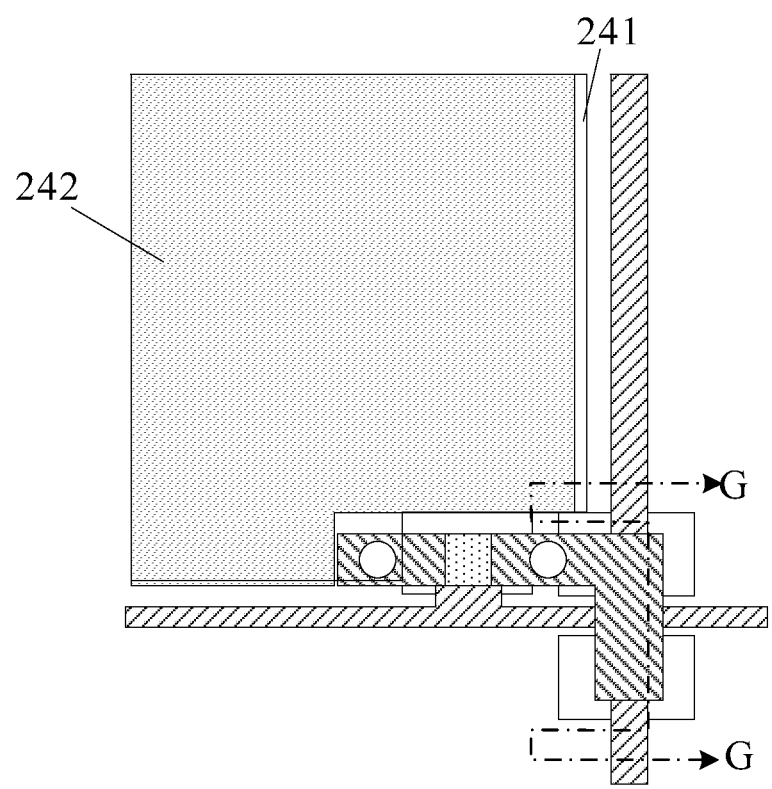
FIG. 15 a structural schematic view illustrating the substrate after a second transparent electrode is formed.

The plan view of the substrate having the second transparent electrode 242 formed thereon is shown in FIG. 15, and the cross-sectional view thereof in a G-G direction is shown in FIG. 2.

It should be noted that, the fabrication method of the array substrate shown in FIG. 2 is described as above as an example. In the embodiment of the present disclosure, when the array substrate shown in FIG. 3 is fabricated, it is necessary to make a certain adjustment on fabrication process.

It should be noted that, in the embodiment of the present disclosure, the array substrate of the FFS-type display device is illustrated as an example. For example, the first transparent electrode 241 is the pixel electrode, and the second transparent electrode 242 is the common electrode; and the first transparent electrode 241 is of a plate-like structure, and the second transparent electrode 242 includes a plurality of spaced strip electrodes.

The array substrate provided by the embodiment of the present disclosure for example is also applicable to other display devices, such as the ADS-type display device, the IPS-type display device or the TN-type display device. In these cases, positions or shapes of the pixel electrode and/or the common electrode may be changed, and correspondingly the processes for forming the pixel electrode and/or the common electrode may be changed, which will not described here for simplicity.

By using the above-described fabrication method of the array substrate, the distance between the data line and the transparent electrode is significantly increased, so that the parasitic capacitance Cdc between the data line and the transparent electrode is effectively reduced, and a poor output voltage due to the excessively large parasitic capacitance is avoided, which effectively prevents flicker of the display screen, reduces data line delay and power consumption, and improves the quality of the display device.

The foregoing embodiments merely are exemplary embodiments of the disclosure, and not intended to define the scope of the disclosure, and the scope of the disclosure is determined by the appended claims.

The present application claims priority of Chinese Patent Application No. 201310739422.6 filed on Dec. 26, 2013, the disclosure of which is incorporated herein by reference in its entirety as part of the present application.

What is claimed is:

1. An array substrate, comprising:
   a gate line and a data line intersecting with each other, wherein
      the data line and the gate line are formed in a same layer on a substrate, the data line is disconnected in a region of the gate line, and
      a connection pattern is formed in the region of the gate line, the connection pattern is insulated from the gate line, and ends of the data line located on both sides of the gate line are electrically connected by the connection pattern;
   a first transparent electrode; and
   a first insulating layer, a gate insulating layer and an etching blocking layer which are disposed on the substrate and between at least a portion of the data line and the first transparent electrode,
   wherein the first insulating layer covers the gate line and other portions of the data line except the ends thereof located on both sides of the gate line, the ends of the data line located on both sides of the gate line are disposed on an upper surface of the first insulating layer, and the upper surface of the first insulating layer is disposed opposite to a lower surface of the first insulating layer and is disposed farther from the substrate than the lower surface of the first insulating layer.

2. The array substrate according to claim 1, wherein the array substrate further comprises
   a TFT, a gate electrode of the TFT being formed in a same layer as the gate line, and being partially disposed on the upper surface of the first insulating layer.

3. The array substrate according to claim 1, wherein
   the gate insulating layer is formed on the first insulating layer;
   the etching blocking layer is formed on the gate insulating layer; and
   in the region of the gate line, a via hole runs through the etching blocking layer and the gate insulating layer, the first insulating layer and the ends of the data line located on both sides of the gate line being disposed at a bottom of the via hole.

4. The array substrate according to claim 3, wherein
   the connection pattern is formed in the via hole, and is electrically connected with the ends of the data line located on both sides of the gate line.

5. The array substrate according to claim 1, further comprising:
   a passivation layer formed on the first transparent electrode, the passivation layer covering the connection pattern located in the region of the gate line; and
   a second transparent electrode formed on the passivation layer.

6. The array substrate according to claim 5, wherein
   the first transparent electrode is a pixel electrode, and the second transparent electrode is a common electrode; and the first transparent electrode is of a plate-like structure, and the second transparent electrode includes a plurality of spaced strip electrodes.

7. A display device, comprising the array substrate according to claim 1.

8. A fabrication method of an array substrate, comprising:
    forming an insulating layer pattern on a transparent substrate by a patterning process, the insulating layer pattern being formed in regions on both sides of a gate line in which a data line is to be formed;
    forming the gate line and the data line in a same layer on the transparent substrate having the insulating layer pattern formed thereon by a patterning process, the data line being disconnected in a region of the gate line, ends of the data line located on both sides of the gate line covering a surface of the insulating layer pattern;
    forming an insulating material layer on the gate line and the data line;
    processing the insulating material layer by an ashing process, to at least expose the ends of the data line located on the surface of the insulating layer pattern and to form a first insulating layer;
    forming a connection pattern corresponding to the region of the gate line on the transparent substrate having the gate line and the data line formed thereon, the connection pattern being insulated from the gate line, and ends of the data line located on both sides of the gate line being electrically connected by the connection pattern;
    forming a first transparent electrode; and
    forming a gate insulating layer and an etching blocking layer between at least a portion of the data line and the first transparent electrode.

9. The fabrication method according to claim 8, further comprising:
    forming the gate insulating layer on the transparent substrate having the first insulating layer formed thereon;
    forming an active layer on the gate insulating layer corresponding to a region of a gate electrode of a TFT by a patterning process;
    forming the etching blocking layer on the transparent substrate having the active layer formed thereon;
    forming a via hole running through the etching blocking layer and the gate insulating layer, to expose the first insulating layer and the ends of the data line located on both sides of the gate line at a bottom of the via hole; and
    forming the connection pattern on the surface of the first insulating layer corresponding to the region of the gate line by a patterning process.

10. The fabrication method according to claim 8, wherein the insulating layer pattern is further located in a channel region of a TFT, and a gate electrode of the TFT partially covers the surface of the insulating layer pattern.

11. The fabrication method of the array substrate according to claim 8, further comprising:
    forming the first transparent electrode on the transparent substrate having the etching blocking layer formed thereon by a patterning process;
    forming a passivation layer on the first transparent electrode by a patterning process, the passivation layer covering the connection pattern located in the region of the gate line; and
    forming a second transparent electrode on the passivation layer by a patterning process.

12. The fabrication method of the array substrate according to claim 11, wherein
    the first transparent electrode is a pixel electrode, and the second transparent electrode is a common electrode; and
    the first transparent electrode is of a plate-like structure, and the second transparent electrode includes a plurality of spaced strip electrodes.

* * * * *